(12) United States Patent
Luo

(10) Patent No.: US 9,997,640 B2
(45) Date of Patent: Jun. 12, 2018

(54) DUAL CHANNEL MEMORY

(71) Applicant: EMPIRE TECHNOLOGY DEVELOPMENT LLC, Wilmington, DE (US)

(72) Inventor: Zhijiong Luo, Poughkeepsie, NY (US)

(73) Assignee: EMPIRE TECHNOLOGY DEVELOPMENT LLC, Wilmington, DE (US)

( * ) Notice: Subject to any disclaimer, the term of this patent is extended or adjusted under 35 U.S.C. 154(b) by 0 days. days.

(21) Appl. No.: 15/252,250

(22) Filed: Aug. 31, 2016

(65) Prior Publication Data

US 2016/0372602 A1 Dec. 22, 2016

Related U.S. Application Data

(62) Division of application No. 14/457,960, filed on Aug. 12, 2014, now Pat. No. 9,466,731.

(51) Int. Cl.
| | |
|---|---|
| *H01L 29/788* | (2006.01) |
| *H01L 29/66* | (2006.01) |
| *G11C 16/04* | (2006.01) |
| *G11C 11/56* | (2006.01) |
| *H01L 21/84* | (2006.01) |

(Continued)

(52) U.S. Cl.
CPC ...... *H01L 29/7887* (2013.01); *G11C 11/5621* (2013.01); *G11C 16/0408* (2013.01); *H01L 21/28273* (2013.01); *H01L 21/84* (2013.01); *H01L 27/11521* (2013.01); *H01L 27/1203* (2013.01); *H01L 27/1211* (2013.01); *H01L 29/0847* (2013.01); *H01L 29/1033* (2013.01); *H01L 29/66795* (2013.01); *H01L 29/66825* (2013.01); *H01L 29/785* (2013.01);

(Continued)

(58) Field of Classification Search
CPC ............... H01L 29/7887; H01L 29/66825
See application file for complete search history.

(56) References Cited

U.S. PATENT DOCUMENTS

| | | |
|---|---|---|
| 4,115,914 A | 9/1978 | Harari |
| 5,162,247 A | 11/1992 | Hazani |

(Continued)

OTHER PUBLICATIONS

Xiong, S. and Bokor, J. "Sensitivity of Double-Gate and FinFET Devices to Process Variations," IEEE Transactions on Electron Devices, vol. 50, No. 11, pp. 2255-2261 (Nov. 2003).

*Primary Examiner* — Asok K Sarkar
*Assistant Examiner* — Grant Withers

(57) ABSTRACT

Technologies are generally described related to a dual channel memory device, system and method of manufacture. Various described devices include utilization of both a front channel and a back channel through a substrate formed underneath a dual gate structure of a semiconductor device. Using two pairs of contacts on opposing sides of the gate structure, where the contact pairs are formed on differently doped layers of the semiconductor device, multiple bits may be stored in the semiconductor device acting as a single memory cell. Memorization may be realized by storing different amount or types of charges on the floating gate, where the charges may impact a conduction status of the channels of the device. By detecting the conduction status of the channels, such as open circuit, close circuit, or high resistance, low resistance, data stored on the device ("0" or "1") may be detected.

15 Claims, 12 Drawing Sheets

(51) Int. Cl.
  *H01L 21/28*    (2006.01)
  *H01L 27/11521* (2017.01)
  *H01L 27/12*    (2006.01)
  *H01L 29/08*    (2006.01)
  *H01L 29/10*    (2006.01)
  *H01L 29/78*    (2006.01)

(52) U.S. Cl.
  CPC ........ *H01L 29/788* (2013.01); *H01L 29/7881* (2013.01); *H01L 29/7883* (2013.01)

(56) References Cited

U.S. PATENT DOCUMENTS

| | | | |
|---|---|---|---|
| 5,656,845 A | 8/1997 | Akbar | |
| 5,693,552 A | 12/1997 | Hsu | |
| 6,204,123 B1 | 3/2001 | Mori | |
| 6,207,978 B1 | 3/2001 | Fastow | |
| 6,239,465 B1 | 5/2001 | Nakagawa | |
| 6,313,486 B1 | 11/2001 | Kencke et al. | |
| 6,313,487 B1 | 11/2001 | Kencke et al. | |
| 6,368,918 B2 | 4/2002 | Cunningham et al. | |
| 7,457,154 B2 | 11/2008 | Yen et al. | |
| 7,619,276 B2 | 11/2009 | Zhu | |
| 7,750,389 B2 | 7/2010 | Prall et al. | |
| 7,829,938 B2 | 11/2010 | Bhattacharyya | |
| 8,194,451 B2 | 6/2012 | Widjaja | |
| 2005/0122775 A1 | 6/2005 | Koyanagi et al. | |
| 2006/0141718 A1 | 6/2006 | Lee | |
| 2006/0281241 A1 | 12/2006 | Mathew | |
| 2007/0018233 A1 | 1/2007 | Hayakawa | |
| 2007/0040197 A1 | 2/2007 | Yang et al. | |
| 2007/0045718 A1 | 3/2007 | Bhattacharyya | |
| 2007/0063252 A1 | 3/2007 | Yuan | |
| 2007/0132054 A1 | 6/2007 | Arghavani et al. | |
| 2007/0212832 A1 | 9/2007 | Orlowski | |
| 2008/0064195 A1 | 3/2008 | Kim | |
| 2008/0067577 A1 | 3/2008 | Wang et al. | |
| 2008/0087942 A1 | 4/2008 | Hsu et al. | |
| 2008/0258207 A1* | 10/2008 | Radosavljevic | H01L 29/41791 257/327 |
| 2009/0032859 A1* | 2/2009 | Zhu | H01L 21/28273 257/316 |
| 2009/0065849 A1 | 3/2009 | Noda | |
| 2009/0097310 A1 | 4/2009 | Hanafi | |
| 2009/0108322 A1 | 4/2009 | Widjaja | |
| 2009/0181506 A1 | 7/2009 | Chen et al. | |
| 2009/0302317 A1 | 12/2009 | Okayasu | |
| 2010/0296341 A1 | 11/2010 | Iwasaki | |
| 2011/0256707 A1 | 10/2011 | Pachamuthu et al. | |
| 2012/0025328 A1 | 2/2012 | Luo et al. | |
| 2012/0056267 A1 | 3/2012 | Yin et al. | |
| 2012/0326155 A1 | 12/2012 | Zhu et al. | |
| 2013/0049117 A1 | 2/2013 | Zhu et al. | |
| 2013/0049138 A1 | 2/2013 | Zhu et al. | |
| 2013/0299885 A1 | 11/2013 | Zhu et al. | |
| 2014/0177336 A1 | 6/2014 | Kwon | |
| 2014/0293709 A1 | 10/2014 | Kwon et al. | |
| 2015/0076602 A1 | 3/2015 | Zhu et al. | |
| 2015/0084130 A1 | 3/2015 | Yin et al. | |
| 2015/0145046 A1 | 5/2015 | Yin et al. | |
| 2015/0187942 A1 | 7/2015 | Zhu et al. | |
| 2015/0214238 A1 | 7/2015 | Shum et al. | |
| 2015/0214316 A1 | 7/2015 | Guo et al. | |
| 2015/0279861 A1 | 10/2015 | Cheng et al. | |

* cited by examiner

DUAL CHANNEL MEMORY

CROSS-REFERENCE TO RELATED APPLICATION

This Application is a divisional application under 35 U.S.C § 121 of and claims priority under 35 U.S.C. § 120 to U.S. patent application Ser. No. 14/457,960, filed on Aug. 12, 2014, now U.S. Pat. No. 9,466,731 . The disclosure of U.S. patent application Ser. No. 14/457,960 is hereby incorporated by reference in its entirety.

BACKGROUND

Unless otherwise indicated herein, the materials described in this section are not prior art to the claims in this application and are not admitted to be prior art by inclusion in this section.

With the proliferation of networking and computing technologies, demand for further scaling down of memory devices has resulted in smaller and denser memory devices. However, further attempts may be hampered by core memory functionality being based on storage of one bit (a "0" and a "1") in each memory cell. To increase memory density, attempts are made to store more than one bit on one device, such as mirror-bit approach. In conventional flash memory devices, one channel may he used to detect the current and threshold voltage shift caused by the charges stored in the gate.

Conventional attempts to increase memory density may use improvements and/or alternative or additional solutions in order to effectively provide higher capacity memory devices without increasing a size of the device.

SUMMARY

The present disclosure generally describes planar dual channel memory devices and techniques to fabricate and use such devices.

According to some examples, semiconductor devices are described. Example semiconductor devices may include a first substrate, an insulator layer positioned over the first substrate, a second substrate positioned over the insulator layer, a gate structure, and a third substrate positioned over a second portion of the second substrate. The gate structure may include a tunnel oxide layer positioned over a first portion of the second substrate, a floating gate layer positioned over the tunnel oxide layer, a control oxide layer positioned over the floating gate layer, and a control gate layer positioned over the control oxide layer. The second portion of the second substrate may include dopants of a first type and the third substrate includes dopants of a second type.

According to other examples, methods to fabricate a semiconductor device are described. Example methods may include forming an insulator layer over a first substrate; forming a second substrate over the insulator layer; thinning a second portion of the second substrate such that a first portion of the second substrate remains intact, where the first portion is substantially central to the second substrate; forming a dual gate structure substantially over the first portion of the second substrate. Example methods may further include doping the second portion of the second substrate with dopants of a first type; forming a third substrate over the second portion of the second substrate; thinning a first portion of the third substrate such that a second portion of the third substrate remains intact, where the second portion of the third substrate is around the first portion of the second substrate; and doping the second portion of the third substrate with dopants of a second type.

According to further examples, systems configured to operate a dual channel memory device are described. Example systems may include a controller configured to selectively activate or deactivate conduction paths corresponding to a first conduction path and/or a second conduction path and a dual channel memory device coupled to the controller. The dual channel memory device may include a first substrate; an insulator layer positioned over the first substrate; a second substrate positioned over the insulator layer; and a gate structure. The gate structure may include a tunnel oxide layer positioned over a first portion of the second substrate; a floating gate layer positioned over the tunnel oxide layer; a control oxide layer positioned over the floating gate layer; a control gate layer positioned over the control oxide layer; and a third substrate positioned over a second portion of the second substrate, where the second portion of the second substrate includes dopants of a first type and the third substrate includes dopants of a second type.

According to vet other examples, semiconductor devices are described. Example semiconductor devices may include a substrate and a vertical gate structure positioned over the substrate. The vertical gate structure may include a tin structure having a bottom surface in contact with a centrally located first portion of the substrate; a tunnel oxide layer configured to rover at least vertical surfaces of the fin structure; a floating gate layer configured to cover surfaces of the tunnel oxide layer; a control oxide layer configured to cover surfaces of the floating gate layer; and a control gate layer configured to cover surfaces of the control oxide layer.

The foregoing summary is illustrative only and is not intended to be in any way limiting. in addition to the illustrative aspects, embodiments, and features described above, further aspects, embodiments, and features will become apparent by reference to the drawings and the following detailed description.

BRIEF DESCRIPTION OF THE DRAWINGS

The foregoing and other features of this disclosure will become more fully apparent from the following description and appended claims, taken in conjunction with the accompanying drawings. Understanding that these drawings depict only several embodiments in accordance with the disclosure and are, therefore, not to be considered limiting of its scope, the disclosure will be described with additional specificity and detail through use of the accompanying drawings, in which:

DETAILED DESCRIPTION

Figure 1A:
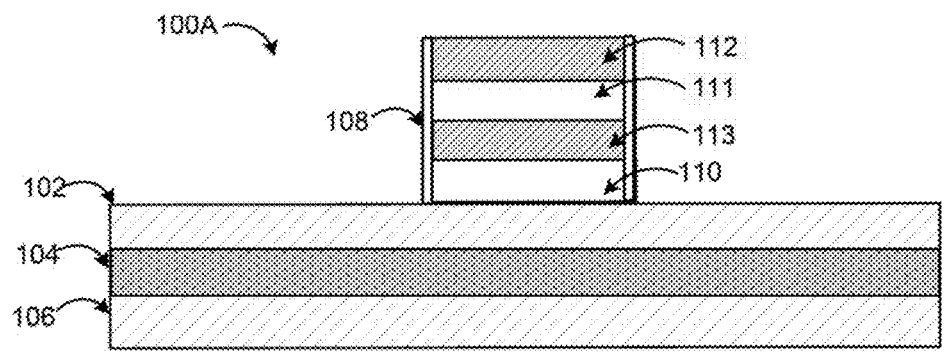
FIGS. 1A and 1B illustrate first stages of an example fabrication of a dual channel memory device through a silicon-on-insulator (SOI) process.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented herein. The aspects of the present disclosure, as generally described herein, and illustrated in the Figures, can be arranged, substituted, combined, separated, and designed in a wide variety of different configurations, all of which are explicitly contemplated herein.

This disclosure is generally drawn, inter alia, to planar dual channel memory devices, as well as systems, methods, and techniques to fabricate and use such devices.

Briefly stated, technologies are generally described related to a dual channel memory device, system and method of manufacture. Various described devices include utilization of both a front channel and a back channel through a substrate formed underneath a dual gate structure of a semiconductor device. Using two pairs of contacts on opposing, sides of the gate structure, where the contact pairs are formed on differently doped layers of the semiconductor device, multiple bits may be stored in the semiconductor device acting as a single memory cell. Memorization may be realized by storing different amount or types of charges on the floating gate, where the charges may impact a conduction status of the channels of the device. By detecting the conduction status of the channels, such as open circuit, close circuit, or high resistance, low resistance, data stored on the device ("0" or "1") may be detected.

The doping and substrate polarity shown in the following embodiments are not limited, and may be switched between n-type and p-type depending on implementation-specific configurations. The term "channel" as used herein refers to the conduction channel of a transistor device. A dual channel memory device according to embodiments makes use of two conduction channels, where memory states may correspond to a conduction state (i.e., whether or not one or both of the channels are in conduction) of the channels formed within the device.

Figure 1B:
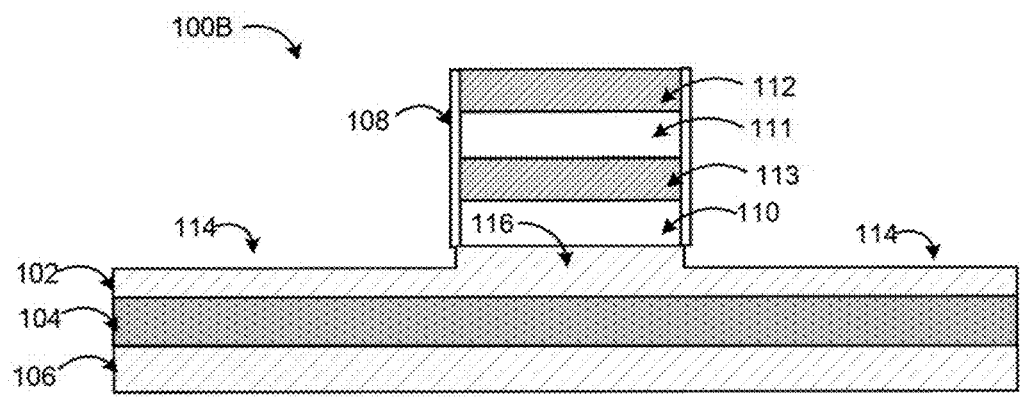

FIGS. 1A and 1B illustrate first stages of an example fabrication of a dual channel memory device through a silicon-on-insulator (SOI) process, configured in accordance with at least some embodiments described herein.

Diagram 100A shows an early phase in fabrication of a dual channel memory device according to some embodiments and includes an insulator 104 on a silicon substrate 106, and a second silicon substrate on the insulator 104. In other embodiments, silicon substrate 106 and the second silicon substrate 102 may be other semiconductor materials, such as Ge, III-V semiconductor materials, or II-VI semiconductor materials. A gate structure comprising a first floating gate 113 and a second floating gate 112 with the first floating gate 113 located over a tunnel oxide layer 110, which in turn is formed over the second silicon substrate 102. Another tunnel oxide layer 111 may be sandwiched between the first floating gate 113 and the second floating gate 112. The tunnel oxide layers and the floating gates may be surrounded by a spacer 108. The second floating gate 112 may also be referred to as the control gate. The other tunnel oxide layer 111 may also be referred to as the control oxide layer.

Diagram 100B shows a subsequent phase, where the second silicon substrate 102 may be recessed vertically ("thinned") as well as horizontally such that a first portion 116 of the second silicon substrate 102 below the tunnel oxide layer 110 has a cross-section area slightly larger than or about equal to the cross-section area of the tunnel oxide layer 110. Next, a vertically thinned second portion 114 of the second silicon substrate 102 may be implanted with dopants of p type. in some examples, the second portion 114 of the second silicon substrate 102 may be implanted heavily with dopants of p type.

Figure 2:
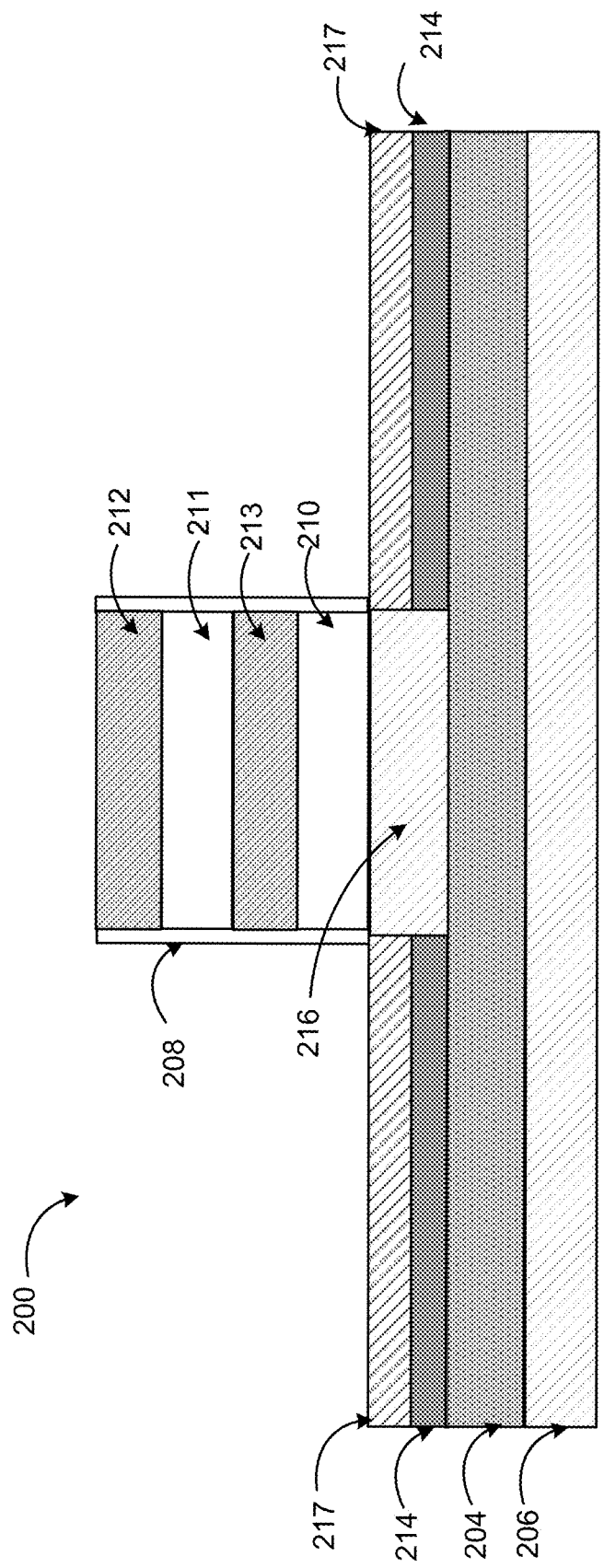
FIG. 2 illustrates a subsequent stage of the example fabrication of the dual channel memory device, where p- and n-doped layers are formed.

FIG. 2 illustrates a subsequent stage of the example fabrication of the dual channel memory device, where p- and n-doped layers are formed, in accordance with at least some embodiments described herein.

Diagram 200 includes the first substrate 206, the insulator 204 on the first substrate 206 and the modified portions of the second silicon substrate 102 comprising the heavily p-doped portions 214 and the doped portion 216 that is substantially located under the tunnel oxide layer 210. A control oxide layer 211, a floating gate 213, and a control gate 212, are located over the tunnel oxide layer 210 formed on the undoped portion 216 of the second substrate. In other embodiments, the undoped portion 216 of the second substrate may be doped with p-type or n-type dopants as well. Spacer 208 is also substantially around the floating gates and the tunnel oxide layers forming the gate structure.

Differently front the fabrication stage in diagram 100B, the device in diagram 200 includes a heavily n-doped layer 217 that is located over the heavily p-doped portions 214 of the second silicon substrate 102. The n-doped layer 217 may be grown epitaxially in some example embodiments. In other embodiments, fast annealing (e.g., laser annealing) may be employed to reduce dopant diffusion in the n-doped layer 217. While not shown in diagram 200, a portion of the n-doped layer 217 and a portion of the p-doped portions 214 of the second substrate may be reduced (thinned) such that portions of the two layers around the gate structure may remain intact and thus may facilitate access to contacts as will be discussed below. In some examples, patterning may be used to remove the portion of the it-doped layer 217 and the p-doped portions 214 of the second silicon substrate 102.

Embodiments are not limited to the techniques such as laser annealing, patterning, or hard masking discussed herein. Other semiconductor fabrication techniques may also be employed to form the structures discussed herein.

Figure 3:
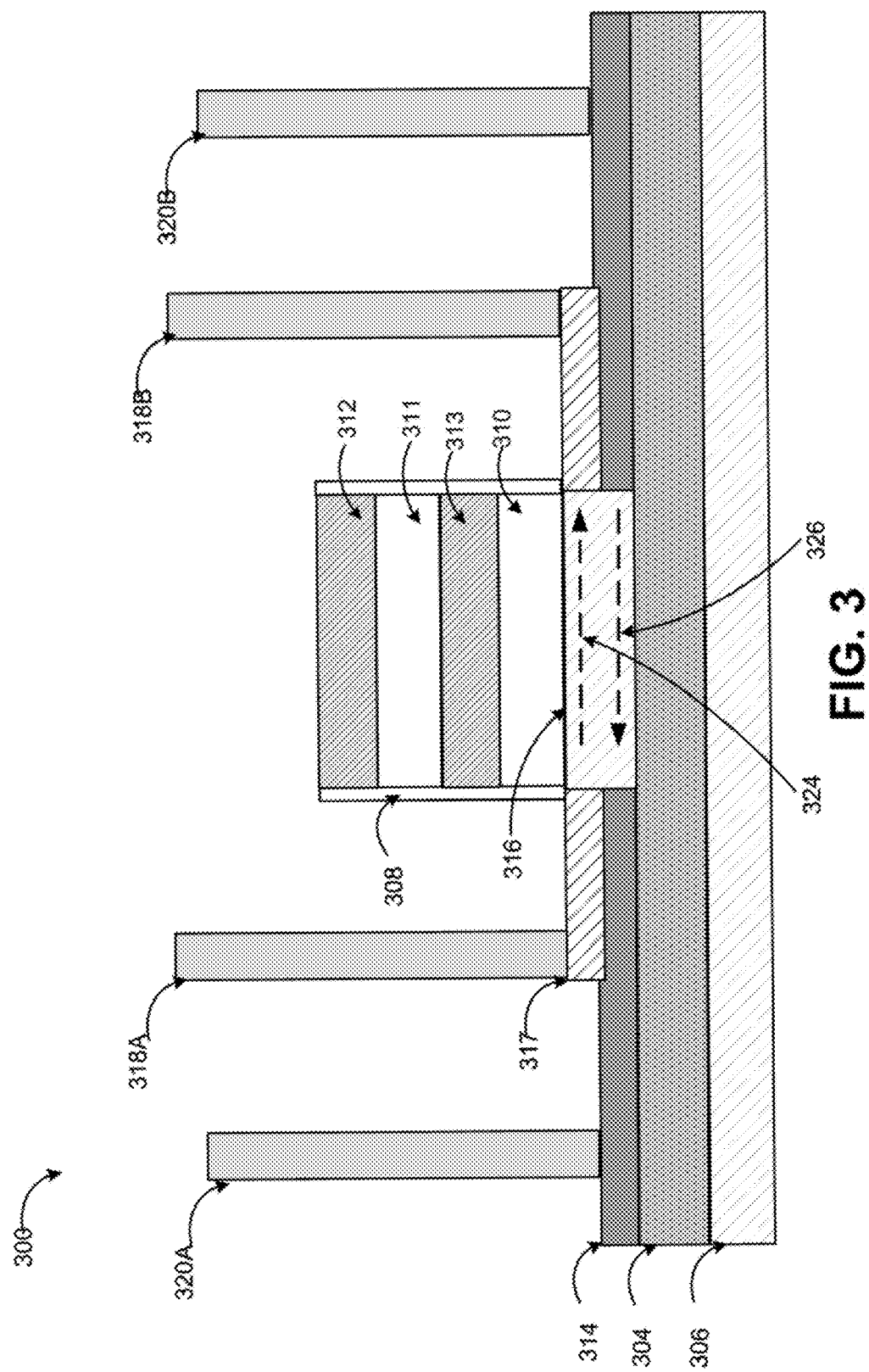
FIG. 3 illustrates another stage of the example fabrication of the dual channel memory device, where contact pairs for front and back channels are provided.

FIG. 3 illustrates another stage of the example fabrication of the dual channel memory device, where contact pairs for front and back channels are provided, in accordance with at least some embodiments described herein.

The example structure in diagram 300 includes first silicon substrate 306, insulator 304, undoped central portion 316 of the second silicon substrate 102 located under the gate structure, heavily p-doped outer portion 314 of the second silicon substrate 102, and the heavily n-doped layer 317 located around the undoped central portion 316 of the second silicon substrate 102. In other embodiments, the undoped central portion 316 of the second silicon substrate 102 may be doped with p-type or n-type dopants as well. The gate structure comprising the sandwiched tunnel oxide layer 310, floating gate 313, control oxide layer 311, and control gate 312 is substantially located on the undoped central portion 316 of the second silicon substrate 102 and surrounded by the spacer 308.

In addition to the structure shown in diagram 200, the structure in diagram 300 includes a first pair of contacts 318A and 318B, where each respective contact from the first pair of contacts is coupled to the heavily n-doped layer 317 about a respective longitudinal end of the of the undoped central portion 316 on opposite sides of the gate structure as shown in the diagram. The structure in diagram 300 further includes a second pair of contacts 320A and 320B coupled to the heavily p-doped outer portion 314 of the second silicon substrate 102 on opposite sides of the p-doped outer portion 314 of the second silicon substrate 102 with respect to the gate structure.

A memory device as shown in diagram 300 may be considered as two devices sharing one channel. There may be three general modes of operation in such a device. In a first mode, a path between first pair of contacts (318A-318B) may be open circuit and a path between second pair of contacts (320A-320B) may be closed circuit. In a second mode, the path between first pair of contacts (318A-318B) may be open circuit and the path between second pair of contacts (320A-320B) may be open circuit. In a third mode, the path between first pair of contacts (318A-318B) may be closed circuit and the path between second pair of contacts (320A-320B) may be open circuit. The path between the first pair of contacts (318A-318B) may pass current using a top channel 324 that allows current flow through the undoped central portion 316 of the second silicon substrate 102 between the two portions of the heavily n-doped layer 317. The path between the second pair of contacts (320A-320B) may pass current using a back channel 326 that allows current flow through the undoped central portion 316 of the second silicon substrate 102 between the p-doped outer portion 314 of the second silicon substrate 102. In various examples contemplated herein, each of the three modes may correspond to a different memory state such that more than one bit of information may be stored in the memory device.

The different operational modes of a memory device according to embodiments are described as different paths being "closed circuit" or "open circuit" herein. This is a simplification for illustrative purposes assuming a transistor structure switches similar to relays. In practice, there is formation of a channel through biasing to promote conduction from sub threshold conduction, linear (non-saturate) operation, and saturated operation. There are also reverse bias leakage and other effects to be considered. A path being "open circuit" refers to substantially no current flow through that path (e.g., operated in a high impedance or open-circuit configuration) and a path being "closed circuit" refers to current flow being enabled through that path (e.g., operated in a low impedance or closed-circuit configuration). Thus, the terms "closed circuit" and "open circuit" should be interpreted as simplifications of the operating configurations of the paths.

Furthermore, additional memory states may be achieved by providing same or different bias voltages to the gate, source and drain contact pairs. In some examples, the voltages may be applied in a way to the various device terminals such that the devices may be operated in reverse bias mode and the high current draw of the forward bias condition may be avoided. The change of memory state may be controlled by a voltage applied to the control gate, and/or the charges stored at the floating gate. With the increase of the gate voltage, the top channel may transition into inversion, and the back channel may transition into depletion, which may "open" the top channel and "close" the back channel.

Figure 4:
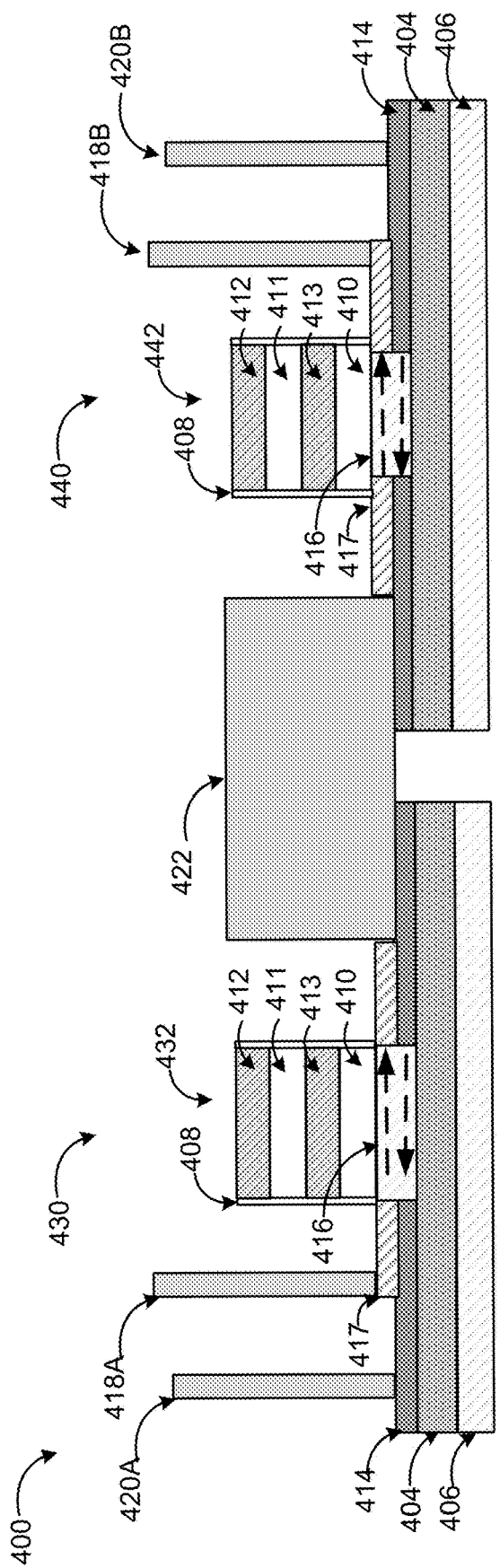
FIG. 4 illustrates side view of an example dual channel memory device with two floating gate structures.

FIG. 4 illustrates side view of an example dual channel memory device with two floating gate structures, arranged in accordance with at least some embodiments described herein.

Diagram 400 shows the side view of a combination of two dual channel memory devices form an array configuration. Components of the two devices 430 and 440 that are structured and/or function similarly are numbered with same reference numerals. For example, both devices 430 and 440 may include first silicon substrate 406, insulator 404, undoped central portion 416 of the second substrate under the gate structure, heavily p doped outer portion 414 of the second substrate, and the heavily n doped layer 417 around the undoped central portion 416 of the second substrate. The gate structures 432 and 442 of the respective devices on the left and right of the figure include the sandwiched tunnel oxide layer 410, floating Rate 413, control oxide layer 411, and control gate 412 and are substantially located on the undoped central portion 416 of the second substrate and surrounded by the spacer 408. The device 430 on the left may further include one of a pair of contacts 418A and 420A on the n doped layer 417 and the p doped outer portion 414 of the second substrate, respectively.

Instead of corresponding contacts of each pair being on opposite sides of the device 430 on the left with respect to the gate structure 432, the second set of contacts 418B and 420B may be on the opposite side of the gate structure 442 of the device 440 on the right. The gate structures 432 and 442 may be substantially similar. The two devices 430 and 440 may be coupled through a connection 422 coupling the n doped layers 417 and the p doped outer portion 414 of the second substrates of both devices. The connection 422 may be operated at a fixed potential (e.g., 0V, −5V, −1V, +5V) to serve as a circuit ground.

As mentioned previously, a dual channel memory device structure as discussed herein may allow utilization of both a front channel and a back channel through the undoped central portion 416 of the second substrate to increase a memory density. Thus, additional storing levels may be identified, and more multi-level storage may be enabled on a single memory device, which may be used in an array configuration as shown in diagram 400. In normal operation, without the applied gate voltage or no charge stored on the floating gate, the front channel is open circuit, and the back channel is closed circuit. With the increase of the gate voltage or adding charges to the floating gate, the top channel may transition into inversion, and the back channel may transition into depletion, which may "open" the top channel and "close" the back channel.

Vertical fin-shaped field effect transistor (FINFET) structures are increasingly used as MOSFET structures, which may also be used in implementing dual channel memory structures according to some embodiments.

Figure 5:
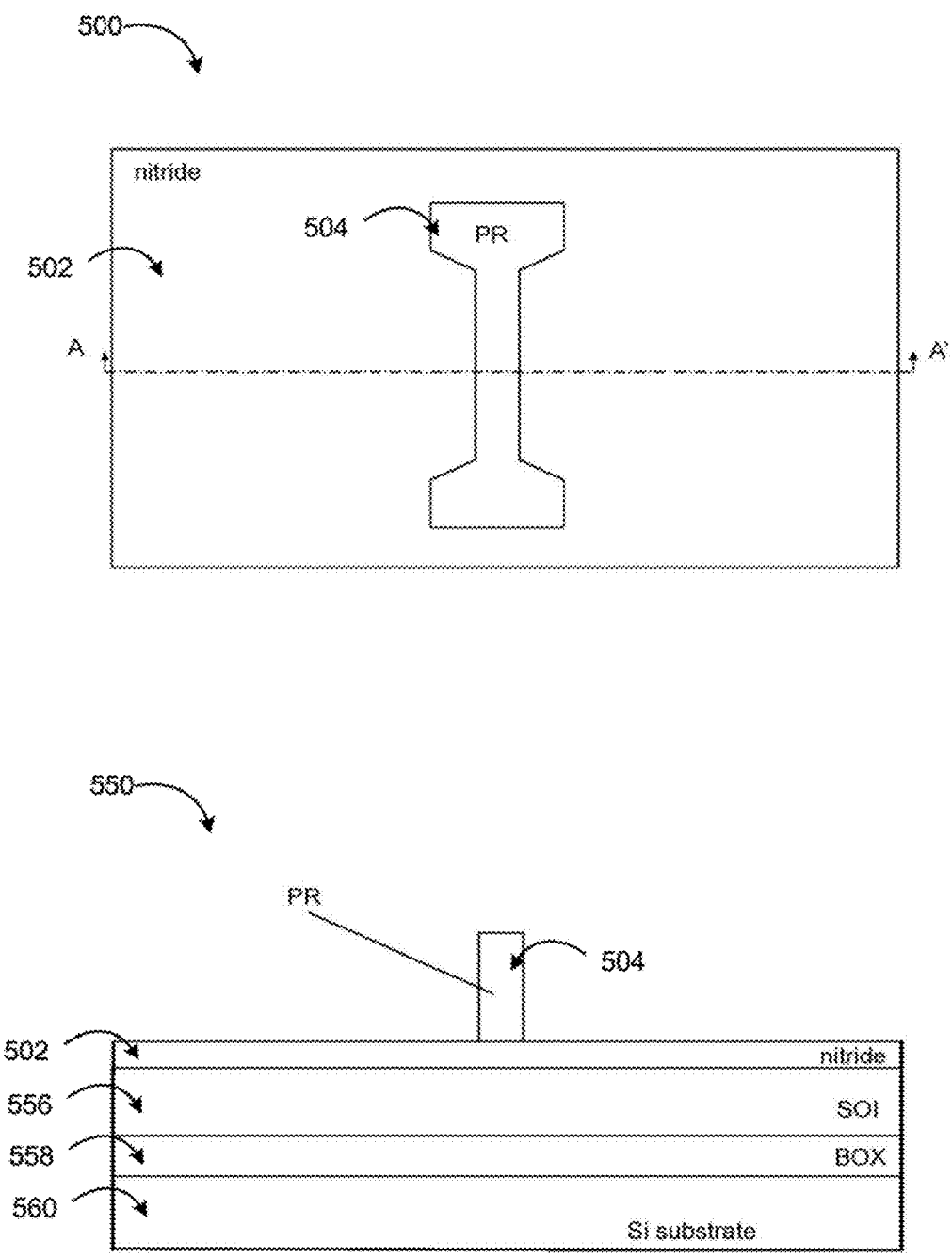
FIG. 5 illustrates top and side views of an initial fabrication stage of an example dual channel memory device implemented using a fin-shaped field effect transistor (FIN-FET) device.

FIG. 5 illustrates top and side views of an initial fabrication stage of an example dual channel memory device implemented using a fin-shaped field effect transistor (FINFET) device, arranged in accordance with at least some embodiments described herein.

Diagram 500 shows top view of an initial stage of fabrication of a vertical FINFET structure according to some embodiments and include a wafer whose SOI layer is deposited with a nitride layer 502 and a photoresist (PR) layer 504 to pattern the fin portion of the FINFET device. The nitride layer may have a thickness in a range between approximately 20 nm and 50 nm.

Diagram 550 shows a side view of the initial fabrication stage of an example vertical FINFET structure along the A-A' axis. An example wafer may include a substrate 560 with a Boron-oxide (BOX) layer 558 on top of the substrate 560. Substrate 560 may be silicon or other semiconductor materials, such as Ge, III-V semiconductor materials, or II-VI semiconductor materials. An SOI layer 556 may be deposited (or grown) over the BOX layer 558; and the nitride layer 502 may be deposited over the SOI layer 556. The photoresist PR layer 504 may be used to pattern the fin portion as mentioned above.

Figure 6:
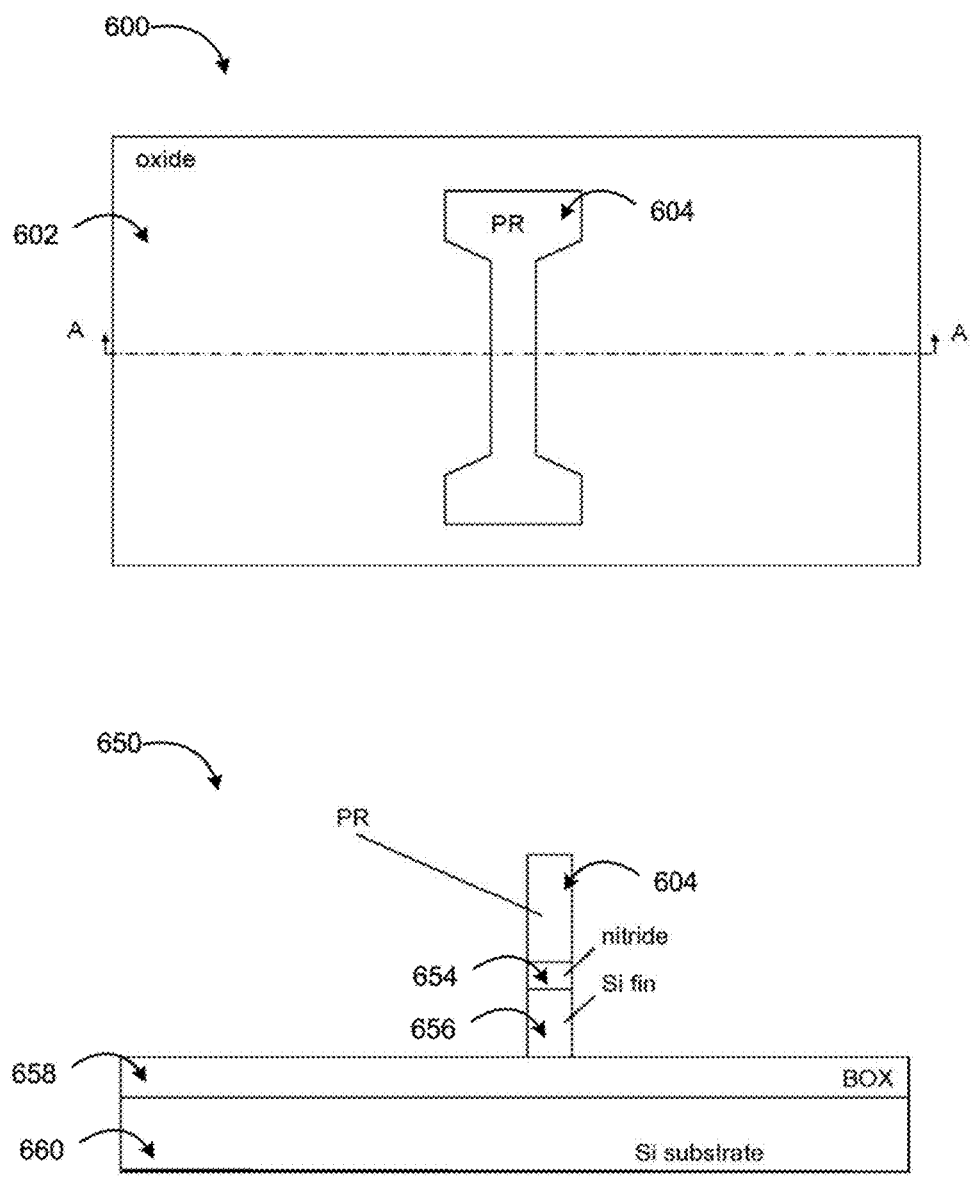
FIG. 6 illustrates top and side views of a second fabrication stage of an example dual channel memory device implemented using a FINFET device.

FIG. 6 illustrates top and side views of a second fabrication stage of an example dual channel memory device implemented using a FINFET device, arranged in accordance with at least some embodiments described herein.

At the subsequent fabrication stage of diagram 600, the nitride and silicon layers may be removed with the exception of the area under a PR layer 604 down to an oxide layer 602 (BOX layer) to form the fin portion of the FINFET structure. The removal of layers may be performed using reactive ion etching (RIE) or similar methods.

Diagram 650 shows a side view of the subsequent fabrication stage of an example vertical FINFET structure along the A-A' axis. After the removal, a resulting wafer may include a substrate 660 with a BOX layer 658 on top of the substrate 660. A silicon fin 656 is positioned on top of the BOX layer 658. A nitride layer 654 is positioned on top of the silicon fin 656. A PR layer 604 is positioned on top of the nitride layer 654. The substrate 660 may be formed using silicon or other suitable materials in various embodiments.

Figure 7:
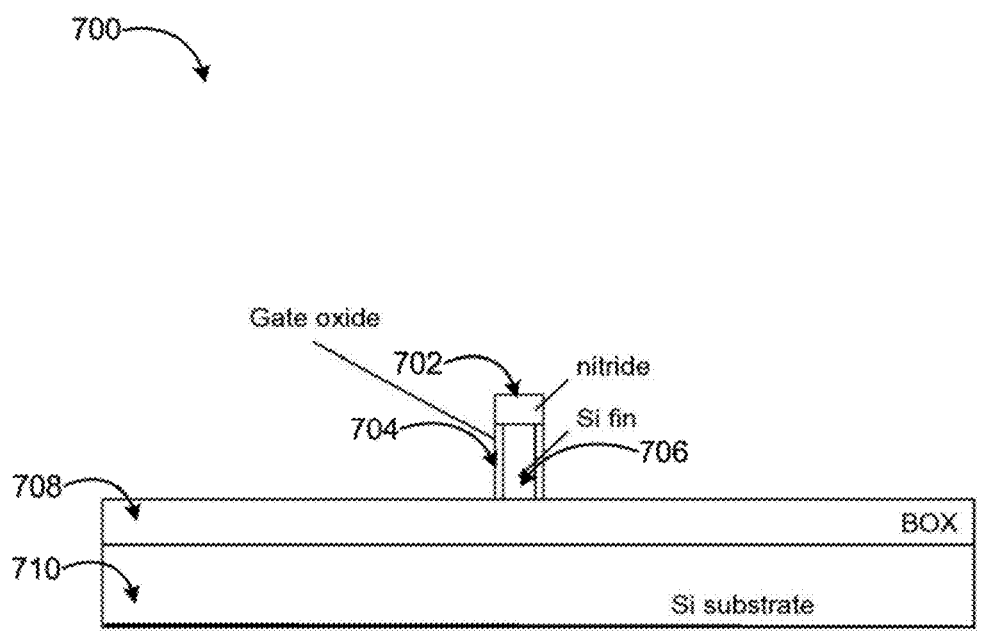
FIG. 7 illustrates side view of a third fabrication stage of an example dual channel memory device implemented using a FINFET device.

FIG. 7 illustrates side view of a third fabrication stage of an example dual channel memory device implemented using a FINFET device, arranged in accordance with at least some embodiments described herein.

In the fabrication stage shown in diagram 700, the PR layer 604 of FIG. 6 may be removed leaving the nitride layer 702 and fin 706 over the BOX layer 708, which is positioned over the substrate 710. In addition, the fin 706 may be covered by a gate oxide layer 704. The gate oxide layer 704 may be formed through thermal oxidation, for example. In other examples, high-k fate dielectric material may be deposited on the surfaces of the fin 706.

Figure 8:
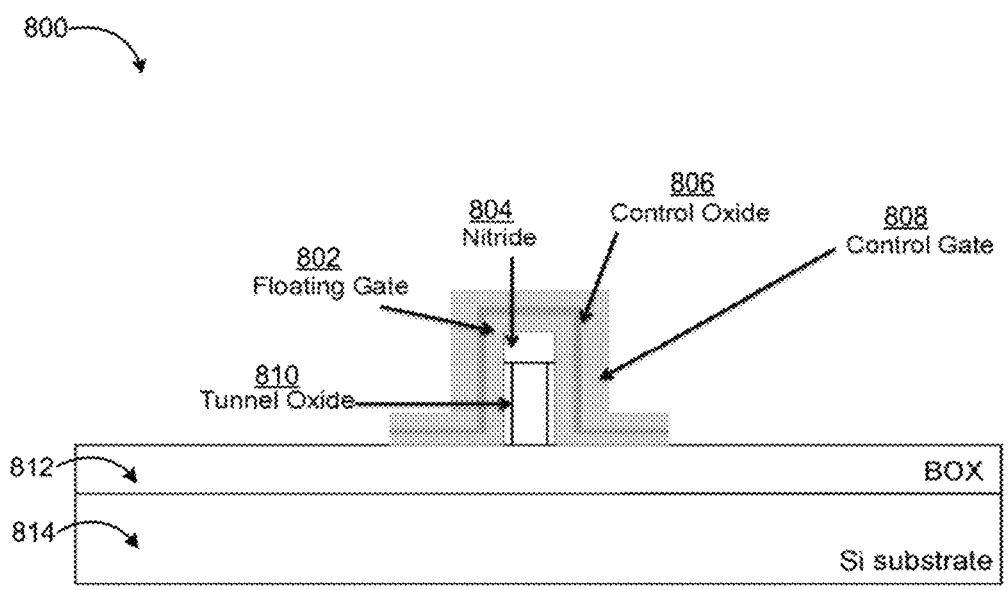
FIG. 8 illustrates side view of a fourth fabrication stage of an example dual channel memory device implemented using a FINFET device.

FIG. 8 illustrates side view of a fourth fabrication stage of an example dual channel memory device implemented using a FINFET device, arranged in accordance with at least some embodiments described herein.

In the fabrication stage shown in diagram 800, a floating gate 802, a control gate layer 808, and a control oxide layer 806 may be firmed over the tunnel oxide layer 810 and nitride layer 804 using one or more deposition or growth techniques. The combined fin gate structure may be positioned over the BOX layer 812, which in turn is positioned over the substrate 814. In some embodiments, a nitride bard mask (not shown) may be formed substantially over all of the surfaces of the control gate layer 808, where the nitride hard mask may be utilized to pattern the gates of the FINFET device.

Figure 9:
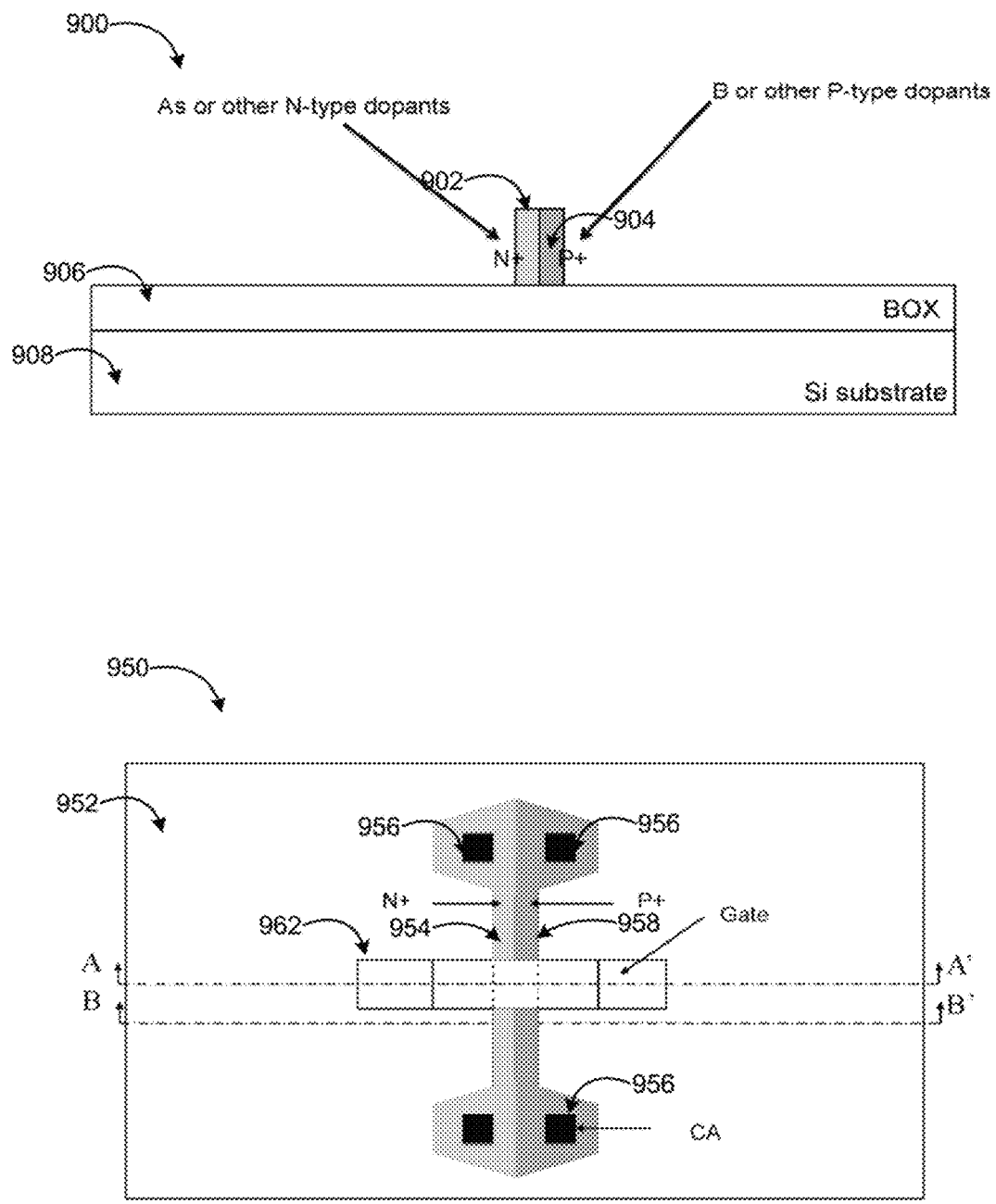
FIG. 9 illustrates to and side views of final fabrication stages of an example dual channel memory device implemented using a FINFET device.

FIG. 9 illustrates top and side views of final fabrication stages of an example dual channel memory device implemented using a FINFET device, arranged in accordance with at least some embodiments described herein.

In the fabrication stage illustrated by diagram 900, sides 902, 904 of the source-drain region of a device may be doped with dopants of different types such that the each of the sides 902 and 904 has an opposite polarity. For example, side 902 may be doped with Arsenic or similar elements to form a negative polarity (e.g., type doped material). Side 904 may be doped with Boron or similar elements to form a positive polarity (e.g., p+ type doped material). The sides 902 and 904 may be doped using angled ion implantation or similar techniques.

A channel region (not shown) within the BOX layer 906 underneath the fin portion may remain substantially undoped or lightly p- or n-doped as the hard mask may block implantation of the channel region. A silicon substrate layer 908 may be in contact with the BOX layer 906 on a side opposite of the device, in some examples.

In the fabrication stage shown in diagram 950, the top view of memory structure 952 may include source-drain regions 956, where the two sides may be doped with opposite polarities forming back channel 958 and front channel 954. Because of the difference in polarity in the source and drain region, this device can be modelled as two devices sharing one channel controlled by a common gate 962. The source and drain regions may include two sections, a p-doped section and an n-doped section. These two sections have different polarities and substantially no current may flow between these two sections. The n-doped sections in both source and drain regions may form a first conducting path, which effectively serve as a first device. The p-doped sections in both source and drain regions may form a second conducting path, which effectively serve as a second device as well. Thus, these two sections in the device may be modelled as two devices sharing one channel.

There may be three general operational modes in a vertical FINFET device, according to some embodiments. The vertical FINFET device may operate with two defined current paths, one current path through the front channel 954 and one current path through the back channel 958. With different applied gate voltage and stored charges on the floating gate, the front channel 954 and the back channel 958 may be changing between accumulation, depletion and inversion modes, and due to the different polarity in the source and drain regions for the front and back channels, different operation modes may be enabled for the front channel 954 and the back channel 958. In a first operational mode, the front channel path may be open circuit (e.g., operated in a high impedance configuration) and the back channel path may be closed circuit (e.g., operated in a low impedance configuration). In a second mode, when the channel portion is depleted, both paths may be open circuit. In a third mode, the front channel path may be closed circuit and the back channel path may be dosed. Thus, each of the three modes may correspond to a different memory state to facilitate storage of more than one bit of information in the memory device. In the table below, the closed circuit state (low impedance configuration) is represented by bit 1 and the open circuit state (high impedance configuration) is represented by bit 0.

TABLE 1

Memory States

| Front Channel Mode | Back Channel Mode | Memory State |
|---|---|---|
| 1 | 0 | 10 |
| 0 | 0 | 00 |
| 0 | 1 | 01 |

The change of memory state may be controlled by the voltage applied to the control gate, and/or the charges stored at the floating gate. In addition, several possible bias modes may be employed to enhance the utilization of the described FINFET devices. For memory operation, a common gate voltage and a common source-drain voltage may be applied on both channels, for example. Alternatively the front and back channels may be biased separately. In the latter case, the voltages may be selectively applied effective to operate the devices (e.g., in diode configuration) in reverse bias mode such that the high current draw of forward bias conditions may be avoided.

A memory device according to various embodiments may be fabricated by the fabrication system using at least one of the semiconductor fabrication techniques selected from the group of chemical vapor deposition (CVD), low pressure CVD (LPCVD), atmospheric pressure CVD (APCVD), ultrahigh vacuum CVD (UHVCVD), atomic layering deposition (ALD), molecular layer deposition (MLD), plasma enhanced CVD (PECVD), metal-organic CVD (MOCVD), molecular beam epitaxy (MBE), sputter deposition, ion implantation, annealing, wet chemical etching, gaseous chemical etching, plasma etching, reactive ion etching (RIE), masking lithography, and/or chemical mechanical polishing (CMP).

Figure 10:
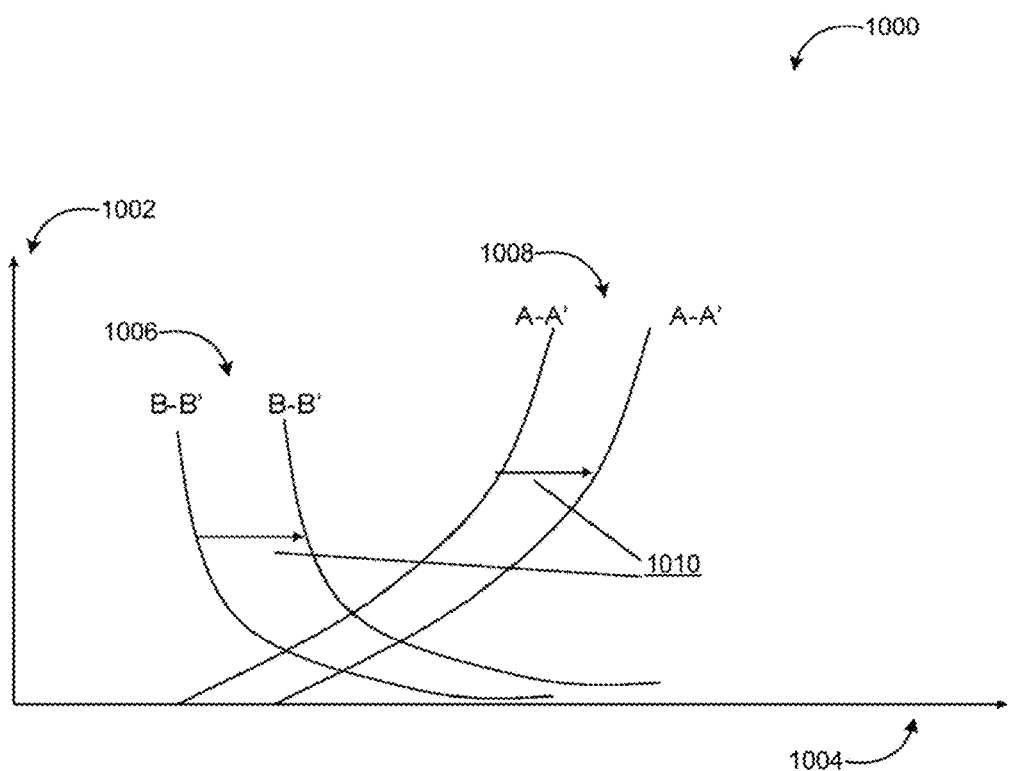
FIG. 10 illustrates an example current-gate voltage diagram for a dual channel memory device.

FIG. 10 illustrates an example current gate voltage graphs for a dual channel memory device, arranged in accordance with at least some embodiments described herein.

Diagram 1000 depicts the current-gate voltage graphs for the two channels of a FINFET structure according to some embodiments across current axis 1002 and gate voltage axis 1004. A first current-gate voltage graph 1006 represents the behavior of current as gate voltage increases through the front channel of a FINFET device structure (A-A' axis). The first current-gate voltage graph 1006 also shows the threshold voltage shift 1010 due to the charge stored in a floating gate (e.g., floating gate 802 of FIG. 8). A second current-gate voltage graph 1008 represents the behavior of current as gate voltage increases through the back channel of the FINFET device structure (B-B' axis). The second current gate voltage graph 1008 also shows the threshold voltage shift 1010 due to the charge stored in the floating gate (e.g., floating gate 802 of FIG. 8).

Being able to sense the current shift due to threshold voltage shifts in both paths (A-A' and B-B' or front channel and back channel), the accuracy in multi-level detection may be increased and the detection range may also be expanded. In conventional multi-level detection, one curve from one device may be used to detect the shift caused by the charges stored in the floating gate. In a device according to some embodiments, the shifts in the two curves may be used to detect the charges stored in the floating gate. In a conventional device, when charge A is stored on the floating gate, the current may shift by B. In a device according to embodiments, when charge A is stored on the floating gate, the current in the front channel may shift by C and the current in the back channel may shift by D, where C and D are different. Since information from both, the front channel and back channel, is available, the charge stored on the floating gate may be determined more accurately compared to conventional devices. Thus, the detection accuracy and detection range may be enhanced over conventional devices. With the increase of the gate voltage, the front channel may transition into closed circuit as shown in the first current-gate voltage graph 1006, and the back channel may transition into close as shown in the second current-gate voltage graph 1008.

In an example implementation, when gate voltages are increased or more charges are added to the gate, the current in A-A' path or front channel may increase (right half of diagram 1000. The increase may follow, $x^2$ (as an estimation), for example, and the current in B-B' path or back channel may decrease following $1/x$ (as an estimation). For a single channel memory, the current-voltage graph may be similar to that of the A-A'. Thus, if the amount of charge stored on a single channel device can be estimated with +/−30% accuracy, for example, with the information from B-B' path, the amount of charges stored on the floating gate may be estimated with increased accuracy such as +/−15%.

Figure 11:
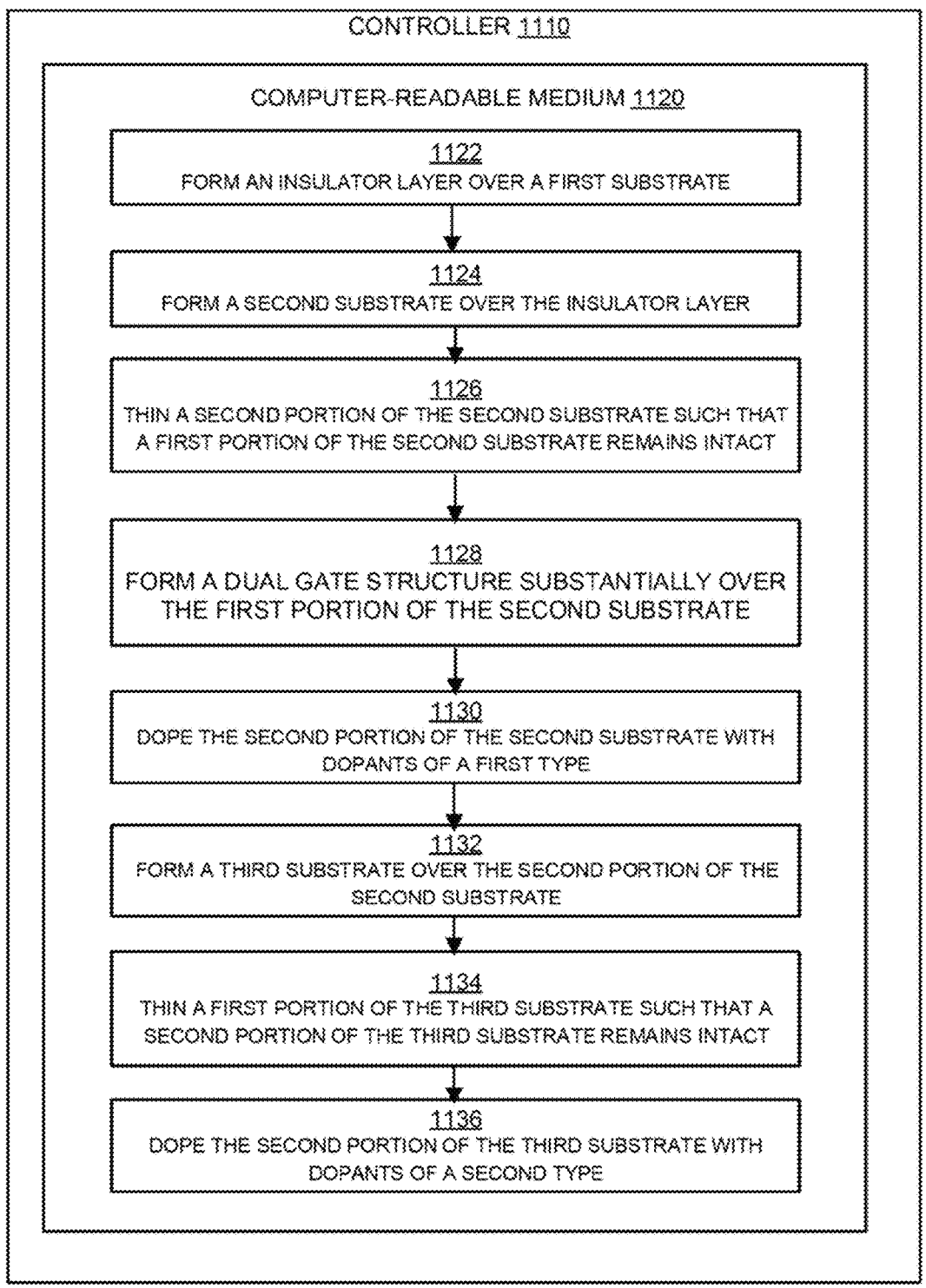
FIG. 11 is a flow diagram illustrating an example method to fabricate a dual channel memory device.

FIG. 11 is a flow diagram illustrating an example method to fabricate a dual channel memory device, arranged in accordance with at least some embodiments described herein.

Example methods may include one or more operations, functions or actions as illustrated by one or more of blocks 1122 through 1136, and may in some embodiments be performed by a controller for a memory fabrication system. The fabrication system may include a number of modules for various stages of fabrication such as etching, deposition, scribing, etc. Some or all of those modules may be managed by a controller that instructs the respective modules to perform the blocks 1122 through 1136. In some embodiments, the controller may be computing device such as a desktop computer, a server, a laptop computer, or other forms of computing devices. Thus, the operations described in the blocks 1122-1136 may also be stored as computer-executable instructions in a non-transitory computer-readable medium, such as a computer-readable medium 1120 of a controller 1110, and may be executable by one or more processors.

An example process to fabricate a dual channel memory device may begin with block 1122, "FORM AN INSULATOR LAYER OVER A FIRST SUBSTRATE," where an insulator layer may be formed over a silicon substrate.

Block 1122 may be followed by block 1124, "FORM A SECOND SUBSTRATE OVER THE INSULATOR LAYER," where a second silicon substrate may be formed over the insulator to support a gate structure.

Block 1124 may be followed by block 1126. "THIN A SECOND PORTION OF THE SECOND SUBSTRATE SUCH THAT A FIRST PORTION OF THE SECOND SUBSTRATE REMAINS INTACT," where a portion of the second substrate around the gate structure may be recessed (or thinned) such that another portion of the second substrate substantially under the gate structure is left intact.

Block 1126 may be followed by block 1128, "FORM A DUAL GATE STRUCTURE SUBSTANTIALLY OVER THE FIRST PORTION OF THE SECOND SUBSTRATE," where the gate structure may be formed substantially over the central portion of the second substrate, which is left intact. The gate structure may include a tunnel oxide layer, a floating gate layer formed over the tunnel oxide layer, another tunnel oxide layer formed over the floating gate layer, and another floating gate layer formed over the other tunnel oxide layer.

Block 1128 may be followed by block 1130, "DOPE THE SECOND PORTION OF THE SECOND SUBSTRATE WITH DOPANTS OF A FIRST TYPE," where the thinned portion of the second substrate around the gate structure may be implanted with p dopants, for example.

Block 1130 may be followed by block 1132, "FORM A THIRD SUBSTRATE OVER THE SECOND PORTION OF THE SECOND SUBSTRATE," where a new substrate layer may be formed (for example, by epitaxial growth) over the thinned portion of the second substrate that is now implanted with p dopants.

Block 1132 may be followed by block 1134, "THIN A FIRST PORTION OF THE THIRD SUBSTRATE SUCH THAT A SECOND PORTION OF THE THIRD SUBSTRATE REMAINS INTACT," where an otter portion of the newly grown third substrate may be removed leaving an inner portion around the gate structure intact.

Block 1134 may be followed by block 1136, "DOPE THE SECOND PORTION OF THE THIRD SUBSTRATE WITH DOPANTS OF A SECOND TYPE," where the inner portion of the third substrate left intact in block 1134 may be implanted with dopants of n type, for example. Subsequently, contact pairs may be provided to opposing sides of the p doped portion of the second substrate and the n-doped portion of the third substrate.

Figure 12:
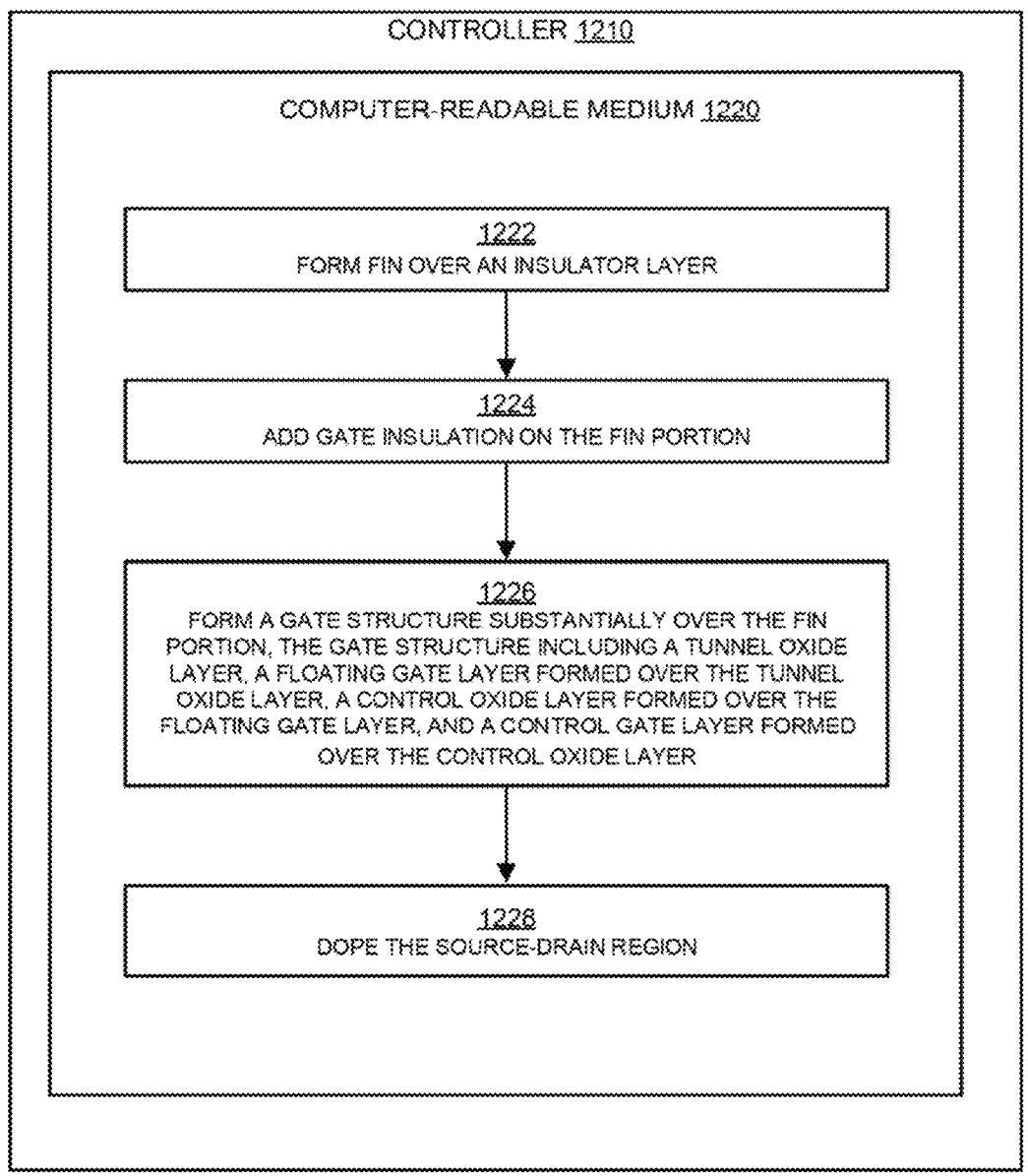
FIG. 12 is a flow diagram illustrating an example method to fabricate a dual channel memory device implemented using a FINFET device, all arranged in accordance with at least some embodiments described herein.

FIG. 12 is a flow diagram illustrating an example method to fabricate a dual channel memory device implemented using a FINFET device, arranged in accordance with at least some embodiments described herein.

Example methods may include one or more operations, functions or actions as illustrated by one or more of blocks 1222 through 1228, and may in some embodiments be performed by a controller for a memory fabrication system. The fabrication system may include a number of modules for various stages of fabrication such as etching, deposition, scribing, etc. Some or all of those modules may be managed by a controller that instructs the respective modules to perform the blocks 1222 through 1228. In some embodiments, the controller may be a computing device such as a desktop computer, a server, a laptop computer, or other forms of computing devices. Thus, the operations described in the blocks 1222-1118 may also be stored as computer-executable instructions in a non-transitory computer-readable medium, such as a computer-readable medium 1220 of a controller 1210, and may be executable by one or more processors.

An example process to fabricate a vertical FINFET dual channel memory device may begin with block 1222, "FORM FIN OVER AN INSULATOR LAYER," where a fin portion may be formed by depositing an insulator such as nitride over a silicon substrate and using photoresist masking over an insulator layer before etching unneeded material.

Block 1222 may be followed by block 1124, "ADD GATE INSULATION ON THE FIN PORTION," where gate oxide or high-k dielectric material may be deposited or grown on the fin portion to support the gate.

Block 1224 may be followed by block 1226, "FORM A GATE STRUCTURE SUBSTANTIALLY OVER THE FIN PORTION, THE GATE STRUCTURE INCLUDING A TUNNEL OXIDE LAYER, A FLOATING GATE LAYER FORMED OVER THE TUNNEL OXIDE LAYER, A CONTROL OXIDE LAYER FORMED OVER THE FLOATING GATE LAYER, AND A CONTROL GATE LAYER FORMED OVER THE CONTROL OXIDE LAYER," where the gate structure may be formed substantially over the central portion of the fin portion.

Block 1226 may be followed by block 1228, "DOPE THE SOURCE-DRAIN REGION," where the gate structure may be masked and source-drain region of the fin portion doped with suitable dopants (e.g., As and B) using an angled ion implanting technique, for example.

The blocks included in the above described process are for illustration purposes. Fabrication of a vertical FINFET dual channel memory device may be implemented by similar processes with fewer or additional blocks. In some embodiments, the blocks may be performed in a different order. In some other embodiments, various blocks may be eliminated. In still other embodiments, various blocks may be divided into additional blocks, supplemented with other blocks, or combined together into fewer blocks.

According to some examples, semiconductor devices are described. Example semiconductor devices may include a first substrate, an insulator layer positioned over the first substrate, a second substrate positioned over the insulator layer, a gate structure, and a third substrate positioned over a second portion of the second substrate. The gate structure may include a tunnel oxide layer positioned over a first portion of the second substrate, a floating gate layer positioned over the tunnel oxide layer, a control oxide layer positioned over the floating gate layer, and a control gate layer positioned over the control oxide layer. The second portion of the second substrate may include dopants of a first type and the third substrate includes dopants of a second type.

According to other examples, the semiconductor device may further include a first pair of contacts configured to contact the third substrate on opposite sides of the gate structure and a second pair of contacts configured to contact the second portion of the second substrate on opposite sides of the gate structure. The third substrate may be positioned around the first portion of the second substrate. The second pair of contacts may be positioned over the second portion of the second substrate between an edge of the semiconductor device and the third substrate. The semiconductor device may further include a spacer formed along vertical surfaces of the gate structure, where the gate structure and the spacer are positioned to cover a lateral cross-section of the first portion of the second substrate. The dopants of the first type may be p dopants and the dopants of the second type may be n dopants. The semiconductor device may be a dual channel memory device.

According to other examples, methods to fabricate a semiconductor device are described. Example methods may include forming an insulator layer over a first substrate; forming a second substrate over the insulator layer; thinning a second portion of the second substrate such that a first portion of the second substrate remains intact, where the first portion is substantially central to the second substrate; forming a dual gate structure substantially over the first portion of the second substrate. Example methods may further include doping the second portion of the second substrate with dopants of a first type; forming a third substrate over the second portion of the second substrate; thinning a first portion of the third substrate such that a second portion of the third substrate remains intact, where the second portion of the third substrate is around the first portion of the second substrate; and doping the second portion of the third substrate with dopants of a second type.

According to further examples, the method may also include providing a first pair of contacts to contact the second portion of the third substrate on opposing sides of the dual gate structure and providing a second pair of contacts to contact the second portion of the second substrate on opposing sides of the dual gate structure. Forming the second pair of contacts may include forming the second pair of contacts over the second portion of the second substrate between an edge of the semiconductor device and the second portion of the third substrate. The method may further include forming a spacer along vertical surfaces of the dual gate structure such that the dual gate structure and the spacer cover a lateral cross-section of the first portion of second substrate.

According to yet other examples, doping the second portion of the second substrate with dopants of a first type may include doping the second portion of the second substrate with p dopants. Doping the second portion of the third substrate with dopants of a second type may include doping the second portion of the third substrate with n dopants. Forming the third substrate over the second portion of the second substrate may include growing the third substrate over the second portion of the second substrate via epitaxial growth. The method may further include forming a hard mask substantially around the dual gate structure to protect the dual gate structure during the thinning of the second portion of the second substrate.

According to further examples, systems configured to operate a dual channel memory device are described. Example systems may include a controller configured to selectively activate or deactivate conduction paths corresponding to a first conduction path and/or a second conduction path and a dual channel memory device coupled to the controller. The dual channel memory device may include a first substrate; an insulator layer positioned over the first substrate; a second substrate positioned over the insulator layer; and a gate structure. The gate structure may include a tunnel oxide layer positioned over a first portion of the second substrate; a floating gate layer positioned over the tunnel oxide layer; a control oxide layer positioned over the floating gate layer; a control gate layer positioned over the control oxide layer; and a third substrate positioned over a second portion of the second substrate, where the second portion of the second substrate includes dopants of a first type and the third substrate includes dopants of a second type.

According to some examples, the controller may be configured to store different information in the dual channel memory device by one of deactivate the first conduction path and activate the second conduction path; deactivate the first conduction path and the second conduction path; or activate the first conduction path and deactivate the second conduction path. A first channel of the dual channel memory device within the first portion of the second substrate corresponding to the first conduction path and a second channel of the dual channel memory device within the first portion of the second substrate corresponding, to the second conduction path may be biased with substantially the same bias voltage selected by the controller.

According to yet further examples, a first channel of the dual channel memory device within the first portion of the second substrate corresponding to the first conduction path and a second channel of the dual channel memory device within the first portion of the second substrate corresponding to the second conduction path may be biased with different bias voltages selected by the controller. The bias voltages may be selected by the controller such that at least one of the first and the second channels operates in reverse bias mode. The first conduction path may be between a first pair of contacts configured to contact the third substrate on opposing sides of the gate structure. The second conduction path may be between a second pair of contacts configured to contact the second portion of the second substrate on opposing sides of the gate structure. The controller may be coupled to the dual channel memory device through the first pair of contacts and the second pair of contacts.

According to yet other examples, semiconductor devices are described. Example semiconductor devices may include a substrate and a vertical gate structure positioned over the substrate. The vertical gate structure may include a fin structure having a bottom surface in contact with a centrally located first portion of the substrate; a tunnel oxide layer configured to cover at least vertical surfaces of the fin structure; a floating gate layer configured to cover surfaces of the tunnel oxide layer; as control oxide layer configured to cover surfaces of the floating gate layer; and a control gate layer configured to cover surfaces of the control oxide layer.

According to further examples, the semiconductor device may include a source layer and a drain layer located on opposite sides of the vertical gate structure, bottom surfaces of the source layer and the drain layer configured to contact the substrate. The source layer and the drain layer may each include at least two regions, the two regions doped with dopants of opposite polarity. The regions of the source layer and the drain layer doped with dopants of same polarity may be on a same side of the semiconductor device relative to the substantially centrally positioned fin structure.

According to some examples, the semiconductor device may also include a first pair of contacts configured to contact the two regions doped with opposite polarity in the source layer and a second pair of contacts configured to contact the two regions doped with opposite polarity in the drain layer. The dopants of opposite polarity may include p dopants and n dopants. The control gate may include a first region and a second region. The first region may be electrically decoupled from the second region. The first region may be configured to control a first conduction channel of the semiconductor device within the substrate corresponding to a first conduction path between the source layer and the drain layer. The second region may be configured to control a second conduction channel of the semiconductor device within the substrate corresponding to a second conduction path between the source layer and the drain layer.

According to some examples, methods to fabricate a semiconductor device are described. Example methods may include forming a vertical gate structure over a substrate. The vertical gate structure may be formed by forming a fin structure having a bottom surface in contact with a centrally located first portion of the substrate, forming a tunnel oxide layer configured to cover at least vertical surfaces of the tin structure, forming a floating gate layer configured to cover surfaces of the tunnel oxide layer, forming a control oxide layer configured to cover surfaces of the floating gate layer, and forming a control gate layer configured to cover surfaces of the control oxide layer.

According to other examples, the methods may further include forming a source layer and a drain layer over the substrate on opposite sides of the vertical gate structure such that bottom surfaces of the source layer and the drain layer contact the substrate. Forming the source layer and the drain layer may include doping two regions within the source layer with dopants of opposite polarity and doping two regions within the drain layer with dopants of opposite polarity. Forming the source layer and the drain layer may further include doping the regions of the source layer and the drain layer doped with dopants of same polarity on a same side of the semiconductor device relative to the substantially centrally positioned fin structure.

According to further examples, the methods may also include providing a first pair of contacts to contact the two regions doped with opposite polarity in the source layer and providing a second pair of contacts to contact the two regions doped with opposite polarity in the drain layer. The dopants of opposite polarity may include p dopants and n dopants. Forming the control gate layer may include forming a first region and a second region within the control gate such that the first region is electrically decoupled from the second region, the first region is to control a first conduction channel of the semiconductor device within the substrate corresponding to a first conduction path between the source layer and the drain layer, and the second region is to control a second conduction channel of the semiconductor device within the substrate corresponding to a second conduction path between the source layer and the drain layer.

There are various vehicles by which processes and/or systems and/or other technologies described herein may be effected (for example, hardware, software, and/or firmware), and that the preferred vehicle will vary with the context in which the processes and/or systems and/or other technologies are deployed. For example, if an implementer determines that speed and accuracy are paramount, the implementer may opt for a mainly hardware and/or firmware vehicle; if flexibility is paramount, the implementer may opt for a mainly software implementation; or, yet again alternatively, the implementer may opt for some combination of hardware, software, and/or firmware.

The foregoing detailed description has set forth various embodiments of the devices and/or processes via the use of block diagrams, flowcharts, and/or examples. Insofar as such block diagrams, flowcharts, and/or examples contain one or more functions and/or operations, each function and/or operation within such block diagrams, flowcharts, or examples may be implemented, individually and/or collectively, by a wide range of hardware, software, firmware, or virtually any combination thereof. In one embodiment, several portions of the subject matter described herein may be implemented via Application Specific Integrated Circuits (ASICs), Field Programmable Gate Arrays (FPGAs), digital signal processors (DSPs), or other integrated formats. However, some aspects of the embodiments disclosed herein, in whole or in part, may be equivalently implemented in integrated circuits, as one or more computer programs running on one or more computers for example, as one or more programs running on one or more computer systems), as one or more programs running on one or more processors (for example as one or more programs running on one or more microprocessors), as firmware, or as virtually any combination thereof, and that designing the circuitry and/or writing the code for the software and/or firmware would be possible in light of this disclosure.

The present disclosure is not to be limited in terms of the particular embodiments described in this application, which are intended as illustrations of various aspects. Many modifications and variations can be made without departing from its spirit and scope Functionally equivalent methods and apparatuses within the scope of the disclosure, in addition to those enumerated herein, will be possible from the foregoing, descriptions. Such modifications and variations are intended to fall within the scope of the appended claims. The present disclosure is to be limited only by the terms of the appended claims, along with the full scope of equivalents to which such claims are entitled. It is to be understood that this disclosure is not limited to particular methods, systems, or components, which can, of course, vary. It is also to be understood that the terminology used herein is for the purpose of describing particular embodiments only, and is not intended to be limiting.

In addition, the mechanisms of the subject matter described herein are capable of being distributed as a program product in a variety of forms, and that an illustrative embodiment of the subject matter described herein applies regardless of the particular type of signal bearing medium used to actually carry out the distribution. Examples of a signal bearing medium include, but are not limited to, the following: a recordable type medium such as a floppy disk, a hard disk drive, a Compact Disc (CD), a Digital Versatile Disk (DVD), a digital tape, a computer memory, etc.; and a transmission type medium such as a digital and/or an analog communication medium (for example, a fiber optic cable, a waveguide, a wired communications link, a wireless communication link, etc.).

Those skilled in the art will recognize that it is common within the art to describe devices and or processes in the fashion set forth herein, and thereafter use engineering practices to integrate such described devices and/or processes into data processing systems. That is, at least a portion of the devices and/or processes described herein may be integrated into a data processing system via a reasonable amount of experimentation. Those having skill in the art will recognize that a typical data processing system generally includes one or more of a system unit housing, a video display device, a memory such as volatile and non-volatile memory, processors such as microprocessors and digital signal processors, computational entities such as operating systems, drivers, graphical user interfaces, and applications programs, one or more interaction devices, such as a touch pad or screen, and/or control systems including feedback loops.

A typical data processing system may be implemented utilizing any suitable commercially available components, such as those typically found in data computing/communication and/or network computing/communication systems. The herein described subject matter sometimes illustrates different components contained within, or connected with, different other components. It is to be understood that such depicted architectures are merely exemplary, and that in fact many other architectures may be implemented which achieve the same functionality. In a conceptual sense any arrangement of components to achieve the same functionality is effectively "associated" such that particular functionality is achieved. Hence, any two components herein combined to achieve a particular functionality may be seen as "associated with" each other such that the particular functionality is achieved, irrespective of architectures or intermediate components. Likewise, any two components so associated may also be viewed as being "operably connected", or "operably coupled", to each other to achieve the particular functionality, and any two components capable of being so associated may also viewed as being "operably couplable", to each other to achieve the particular functionality. Specific examples of operably couplable include but are not limited to physically connectable and/or physically interacting components and/or wirelessly interactable and/or wirelessly interacting components and/or logically interacting and/or logically interactable components.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (for example, bodies of the appended claims) are generally intended as "open" terms (for example, the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (for example, "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (for example, the bare recitation of "two recitations," without other modifiers, means at least two recitations, or two or more recitations).

Furthermore, in those instances where a convention analogous to "at least one of A, B, and C, etc." is used, in general such a construction is intended in the sense one having skill in the art would understand the convention (for example, "a system having at least one of A, B, and C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

As will be understood by one skilled in the art, for any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," "greater than," "less than," and the like include the number recited and refer to ranges which can be subsequently broken down into subranges as discussed above. Finally, as will be understood by one skilled in the art, a range includes each individual member. Thus, for example, a group having 1-3 cells refers to groups having 1, 2, or 3 cells. Similarly, a group having 1-5 cells refers to groups having 1, 2, 3, 4, or 5 cells, and so forth.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

What is claimed is:

1. A semiconductor device, comprising:
    a first substrate; and
    a vertical gate structure positioned over the first substrate, wherein the vertical gate structure comprises:
        a fin structure that has a bottom surface in contact with a centrally located first portion of the first substrate;
        a tunnel oxide layer configured to cover at least one vertical surface of the fin structure;
        a floating gate layer configured to cover at least one surface of the tunnel oxide layer;
        a control oxide layer configured to cover at least one surface of the floating gate layer; and
        a control gate layer configured to cover at least one surface of the control oxide layer, wherein the control gate layer comprises:
            a first section configured to control a first conduction channel of the semiconductor device within the first substrate that corresponds to a first conduction path between a source layer and a drain layer; and
            a second section configured to control a second conduction channel of the semiconductor device within the first substrate that corresponds to a second conduction path between the source layer and the drain layer.

2. The semiconductor device of claim 1, wherein the source layer and the drain layer are located on opposite sides of the vertical gate structure, and wherein bottom surfaces of the source layer and the drain layer are configured to contact the first substrate.

3. The semiconductor device of claim 2, wherein:
    the source layer includes at least two regions,
    the drain layer includes at least two other regions, and
    the at least two regions of the source layer and the at least two other regions of the drain layer are doped with dopants of an opposite polarity.

4. The semiconductor device of claim 3, further comprising:
    a first pair of contacts configured to contact the at least two regions of the source layer; and
    a second pair of contacts configured to contact the at least two other regions of the drain layer.

5. The semiconductor device of claim 3, wherein the dopants of the opposite polarity include p dopants and n dopants.

6. The semiconductor device of claim 1, wherein the semiconductor device is implemented as pan of a vertical fin-shaped, field effect transistor (FINFET) structure.

7. The semiconductor device of claim 1, further comprising:
    a nitride hard mask formed substantially around and over the control gate layer, wherein the nitride hard mask is utilized to protect the control gate layer during a thinning of a portion of a second substrate.

8. The semiconductor device of claim 1, wherein the first section and the second section have opposite polarities, and wherein the first section is electrically decoupled from the second section.

9. The semiconductor device of claim 1, further comprising:
a nitride hard mask formed substantially around and over the control gate layer, wherein the nitride hard mask is utilized to pattern one or more gates of the fin structure.

10. A system configured to operate a dual channel memory device, the system comprising:
a controller configured to selectively activate or deactivate conduction paths that correspond to one or more of a first conduction path and a second conduction path; and
the dual channel memory device coupled to the controller, wherein the dual channel memory device comprises:
a first substrate;
a vertical gate structure positioned over the first substrate, wherein the vertical gate structure comprises:
a fin structure that has a bottom surface in contact with a centrally located first portion of the first substrate;
a tunnel oxide layer configured to cover at least one vertical surface of the fin structure;
a floating gate layer configured to cover at least one surface of the tunnel oxide layer;
a control oxide layer configured to cover at least one surface of the floating gate layer; and
a control gate layer configured to cover at least one surface of the control oxide layer, wherein the control gate layer comprises:
a first section configured to control a first conduction channel of the dual channel memory device within the first substrate that corresponds to the first conduction path, which is between a source layer and a drain layer; and
a second section configured to control a second conduction channel of the dual channel memory device within the first substrate that corresponds to the second conduction path, which is between the source layer and the drain layer.

11. The system of claim 10, wherein the controller is further configured to:
store different information in the dual channel memory device by one of
deactivation of the first conduction path and activation of the second conduction path;
deactivation of the first conduction path and the second conduction path; and
activation of the first conduction path and deactivation of the second conduction path.

12. The system of claim 10, wherein:
the first conduction channel of the dual channel memory device and the second conduction channel of the dual channel memory device are biased with substantially a same bias voltage selected by the controller.

13. The system of claim 10, wherein:
the first conduction channel of the dual channel memory device and the second conduction channel of the dual channel memory device are biased with different bias voltages selected by the controller, and
the controller is configured to select the different bias voltages such that at least one of the first conduction channel of the dual channel memory device and the second conduction channel of the dual channel memory device operates in a reverse bias mode.

14. A method to fabricate a semiconductor device, the method comprising:
forming a first substrate; and
forming a vertical gate structure positioned over the first substrate, wherein forming the vertical gate structure comprises:
forming a fin structure that has a bottom surface in contact with a centrally located first portion of the first substrate;
forming a tunnel oxide layer configured to cover at least one vertical surface of the fin structure;
forming a floating gate layer configured to cover at least one surface of the tunnel oxide layer,
forming a control oxide layer configured to cover at least one surface of the floating gate layer; and
forming a control gate layer configured to cover at least one surface of the control oxide layer, wherein forming the control gate layer comprises:
forming a first section configured to control a first conduction channel of the semiconductor device within the first substrate that corresponds to a first conduction path between a source layer and a drain layer: and
forming a second section configured to control a second conduction channel of the semiconductor device within the first substrate that corresponds to a second conduction path between the source layer and the drain layer.

15. A semiconductor device, comprising:
a first substrate;
a vertical gate structure positioned over the first substrate, wherein the vertical gate structure comprises a tin structure, a tunnel oxide layer, a floating gate layer, a control oxide layer, and a control gate layer; and
a source layer and a drain layer located on opposite sides of the vertical gate structure, wherein:
the source layer includes at least two regions and the drain layer includes at least two other regions, and
the at least two regions of the source layer and the at least two other regions of the drain layer are doped with dopants of an opposite polarity to form a first conduction channel and a second conduction channel.

* * * * *